(12) United States Patent
Hwang (10) Patent No.: US 7,710,773 B2
(45) Date of Patent: May 4, 2010

(54) NONVOLATILE MEMORY DEVICES THAT SUPPORT VIRTUAL PAGE STORAGE USING ODD-STATE MEMORY CELLS (75) Inventor: Sang Won Hwang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/350,588

(22) Filed: Jan. 8, 2009

(65) Prior Publication Data

US 2009/0129161 A1    May 21, 2009

Related U.S. Application Data (62) Division of application No. 12/119,608, filed on May 13, 2008, now Pat. No. 7,483,301, which is a division of application No. 11/358,648, filed on Feb. 21, 2006, now Pat. No. 7,388,778.

(30) Foreign Application Priority Data

Apr. 27, 2005    (KR)  ................ 2005-34825

(51) Int. Cl.
G11C 16/04    (2006.01)
G11C 11/56    (2006.01)
(52) U.S. Cl. .............. 365/185.03; 365/168; 365/185.17
(58) Field of Classification Search ............. 365/185.03
See application file for complete search history.

(56) References Cited

U.S. PATENT DOCUMENTS 4,809,227 A * 2/1989 Suzuki et al. ............... 365/168
5,021,999 A * 6/1991 Kohda et al. ............ 365/185.03
5,521,865 A * 5/1996 Ohuchi et al. .......... 365/185.22
5,652,719 A    7/1997 Tanaka et al.
5,696,717 A   12/1997 Koh
5,734,609 A    3/1998 Choi et al.
5,768,188 A    6/1998 Park et al.
5,781,478 A *  7/1998 Takeuchi et al. ....... 365/185.11

(Continued)

FOREIGN PATENT DOCUMENTS

JP    2002511655 T    4/2002

(Continued)

OTHER PUBLICATIONS

Jung et al., "A 3.3-V Single Power Supply 16-Mb Nonvolatile Virtual DRAM Using a NAND Flash Memory Technology," IEEE Journal of Solid-State Circuits, vol. 32, No. 11, Nov. 1997, pp. 1748-1757.

(Continued)

Primary Examiner—Son L Mai
(74) Attorney, Agent, or Firm—Myers Bigel Sibley & Sajovec (57) ABSTRACT A nonvolatile memory array includes first and second blocks of three-state memory cells therein. These first and second blocks are configured to operate individually as first and second blocks of physical memory cells, respectively, and collectively as an additional block of virtual memory cells. The first and second blocks of memory cells and the additional block of virtual memory cells may be read independently to provide a total of three blocks of read data.

8 Claims, 11 Drawing Sheets

U.S. PATENT DOCUMENTS

| | | | |
|---|---|---|---|
| 5,812,454 A | 9/1998 | Choi | |
| 5,841,693 A | 11/1998 | Tsukiji | |
| 5,848,009 A | 12/1998 | Lee et al. | |
| 5,862,074 A | 1/1999 | Park | |
| 5,936,887 A | 8/1999 | Choi et al. | |
| 5,973,958 A * | 10/1999 | Parker | 365/185.03 |
| 6,137,729 A | 10/2000 | Choi | |
| 6,181,606 B1 | 1/2001 | Choi et al. | |
| 6,259,628 B1 | 7/2001 | Park | |
| 6,288,935 B1 | 9/2001 | Shibata et al. | |
| 6,549,457 B1 | 4/2003 | Srinivasan et al. | |
| 6,587,372 B2 * | 7/2003 | Blodgett | 365/185.03 |
| 6,594,178 B2 | 7/2003 | Choi et al. | |
| 6,725,321 B1 * | 4/2004 | Sinclair et al. | 711/103 |
| 6,735,116 B2 | 5/2004 | Lee et al. | |
| 6,772,274 B1 * | 8/2004 | Estakhri | 711/103 |
| 6,813,184 B2 | 11/2004 | Lee | |
| 6,847,550 B2 * | 1/2005 | Park | 365/185.03 |
| 6,853,585 B2 | 2/2005 | Lee et al. | |
| 6,865,110 B1 | 3/2005 | Park | |
| 6,937,520 B2 * | 8/2005 | Ono et al. | 365/185.18 |
| 7,057,942 B2 * | 6/2006 | Suda et al. | 365/189.01 |
| 7,085,909 B2 * | 8/2006 | Ananthanarayanan et al. | 711/202 |
| 7,164,601 B2 * | 1/2007 | Mitani et al. | 365/185.03 |
| 7,215,580 B2 * | 5/2007 | Gorobets | 365/189.02 |
| 7,411,820 B2 * | 8/2008 | Mo et al. | 365/185.03 |
| 7,508,711 B2 * | 3/2009 | Goda | 365/185.17 |
| 2003/0086316 A1 | 5/2003 | Kurjanowicz et al. | |
| 2004/0080979 A1 | 4/2004 | Park | |
| 2004/0257843 A1 * | 12/2004 | Meynard et al. | 363/124 |
| 2005/0007801 A1 | 1/2005 | Barzilai et al. | |
| 2005/0174841 A1 * | 8/2005 | Ho | 365/185.03 |
| 2005/0246480 A1 * | 11/2005 | Fu | 711/103 |
| 2006/0161723 A1 * | 7/2006 | Sena et al. | 711/103 |
| 2007/0106875 A1 * | 5/2007 | Mather | 711/206 |
| 2007/0195597 A1 * | 8/2007 | Park et al. | 365/185.03 |

FOREIGN PATENT DOCUMENTS

| | | |
|---|---|---|
| KR | 10-0408944 | 11/2003 |
| KR | 10-2004-0098642 | 11/2004 |

OTHER PUBLICATIONS

Takeuchi et al., "A Multipage Cell Architecture for High-Speed Programming Multilevel NAND Flash Memories," IEEE Journal of Solid-State Circuits, vol. 33, No. 8, Aug. 1998, pp. 1228-1238.

Tanaka et al., "A 3.4 Mbyte/sec Programming 3-Level NAND Flash Memory Saving 40% Die Size Per Bit," 1997 Symposium on VLSI Circuits Digest of Technical Papers, pp. 65-66.

European Search Report, European Application No. 06004699.2, Sep. 1, 2006.

* cited by examiner

|  | INITIAL STATE (BITS 1 + 2) | VIRTUAL PROGRAM (BIT 3) |  | BIT 1/BIT 2/BIT 3 |
|---|---|---|---|---|
| case (a) | VR1 VR2 | "1" → VR1 VR2 | (NO CHANGE) | 1/1/1 |
| case (b) | VR1 VR2 | "0" → VR1 VR2 | (PROGRAM UPPER + LOWER) | 1/1/0 |
| case (c) | VR1 VR2 | "1" → VR1 VR2 | (NO CHANGE) | 1/0/1 |
| case (d) | VR1 VR2 | "0" → VR1 VR2 | (PROGRAM LOWER) | 1/0/0 |
| case (e) | VR1 VR2 | "1" → VR1 VR2 | (NO CHANGE) | 0/1/1 |
| case (f) | VR1 VR2 | "0" → VR1 VR2 | (PROGRAM UPPER) | 0/1/0 |
| case (g) | VR1 VR2 | "1" → VR1 VR2 | (NO CHANGE) | 0/0/1 |
| case (h) | VR1 VR2 | "0" → VR1 VR2 | (PROGRAM UPPER) | 0/0/0 |

VIRTUAL CELL PROGRAMMING

NONVOLATILE MEMORY DEVICES THAT SUPPORT VIRTUAL PAGE STORAGE USING ODD-STATE MEMORY CELLS

CROSS-REFERENCE TO PRIORITY APPLICATION AND RELATED APPLICATIONS

This application is a divisional of U.S. application Ser. No. 12/119,608, filed May 13, 2008, now U.S. Pat. No. 7,483,301 which is a divisional of U.S. application Ser. No. 11/358,648, filed Feb. 21, 2006, now U.S. Pat. No. 7,388,778 which claims priority to Korean Application No. 2005-34825, filed Apr. 27, 2005. The disclosure of U.S. application Ser. Nos. 11/358,648 and 12/119,608 are hereby incorporated herein by reference.

FIELD

The present invention relates to integrated circuit memory devices and, more particularly, to nonvolatile memory devices and methods of programming nonvolatile memory devices.

BACKGROUND

One class of nonvolatile memory devices includes electrically erasable programmable read only memory (EEPROM), which may be used in many applications including embedded applications and mass storage applications. In typical embedded applications, an EEPROM device may be used to provide code storage in personal computers or mobile phones, for example, where fast random access read times may be required. Typical mass storage applications include memory card applications requiring high capacity and low cost.

Figure 1A:
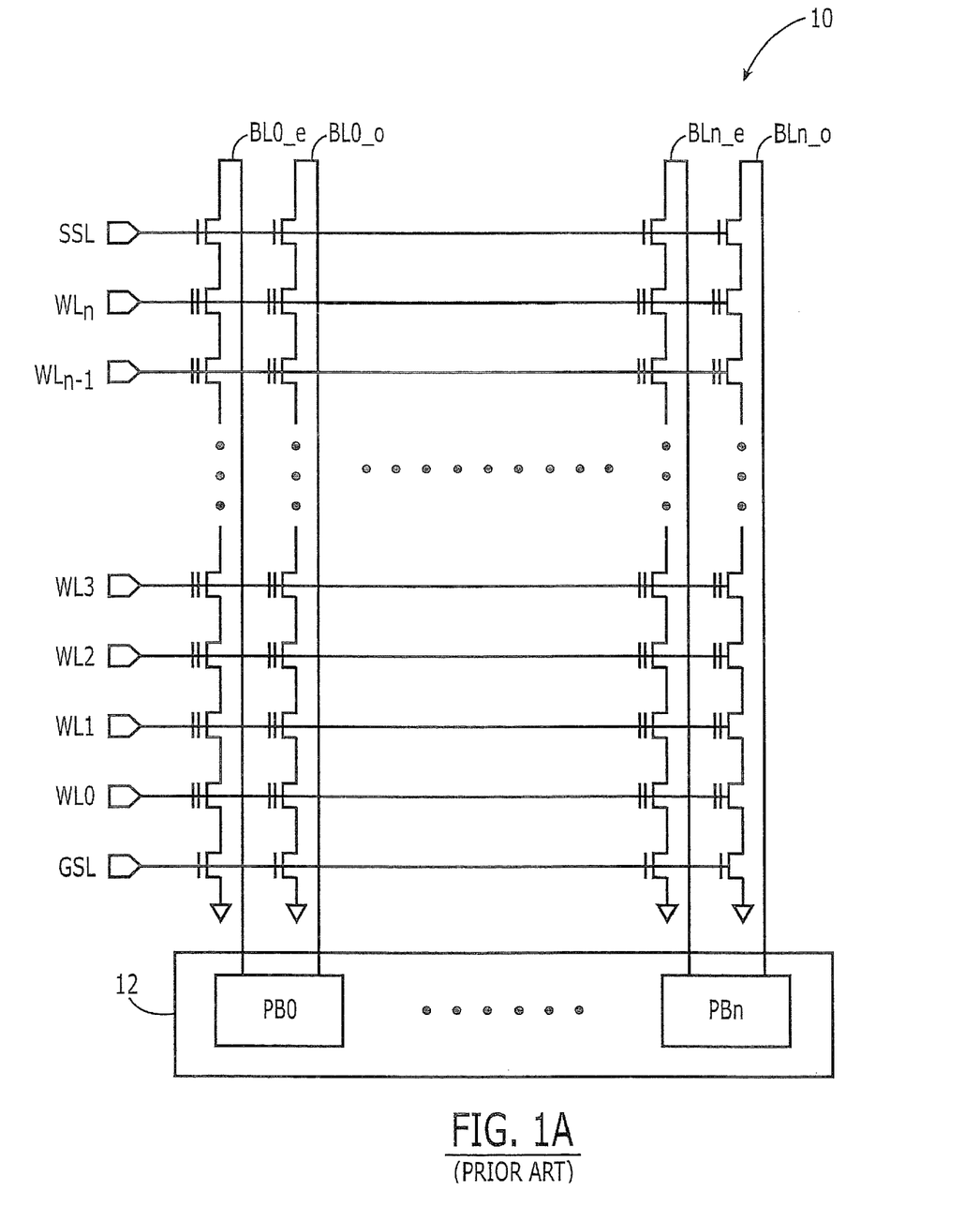
FIG. 1A is an electrical schematic of a conventional nonvolatile memory device having NAND-type strings of EEPROM cells therein.

One category of EEPROM devices includes NAND-type flash memories, which can provide a low cost and high capacity alternative to other forms of nonvolatile memory. FIG. 1A illustrates a conventional flash memory array 10 having a plurality of NAND-type strings therein. Each of these NAND-type strings includes a plurality of EEPROM cells, which are associated with respective even and odd bit lines (BL0_e, BL0_o . . . , BLn_e, BLn_o). These bit lines are connected to a page buffer 12 having a plurality of buffer circuits (PB0, . . . , PBn) therein. Each EEPROM cell includes a floating gate electrode and a control gate electrode, which is electrically connected to a respective word line (WL0, WL1, . . . , WLn). Access to each NAND string is enabled by driving a string select line (SSL) to a logic 1 voltage during reading and programming operations. Each NAND string also includes a respective ground select transistor, which is electrically connected to a ground select line (GSL).

Figures 1B, 1C:
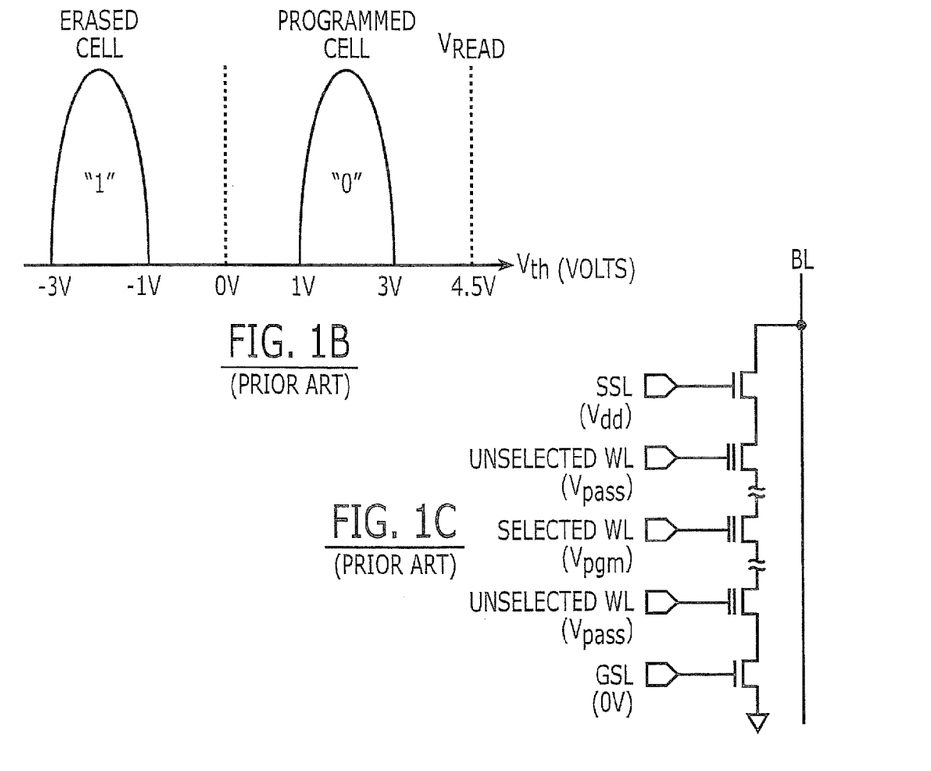
FIG. 1B is a graph illustrating the relative threshold voltages of an erased and programmed EEPROM cell, according to the prior art.
FIG. 1C is an electrical schematic of a NAND-type string of EEPROM cells showing programming bias conditions.

As illustrated by FIG. 1B, the EEPROM cells within the flash memory array 10 of FIG. 1A may be cells that support a single programmed state. EEPROM cells that support only a single programmed state are typically referred to as single level cells (SLC). In particular, an SLC may support an erased state, which may be treated as a logic 1 storage value, and a programmed state, which may be treated as a logic 0 storage value. The SLC may have a negative threshold voltage (Vth) when erased (e.g., $-3V<Vth<-1V$) and a positive threshold voltage when programmed (e.g., $1V<Vth<3V$). This programmed state may be achieved by setting the bit line BL to a logic 0 value (e.g., 0 Volts), applying a program voltage (Vpgm) to a selected EEPROM cell and applying a pass voltage (Vpass) to the unselected EEPROM cells within a string, as illustrated by FIG. 1C. In addition, during programming the NAND string may be enabled by applying a positive voltage (e.g., power supply voltage Vdd) to the string select line (SSL) and a ground voltage (e.g., 0 Volts) to the ground select line (GSL).

Figure 1D:
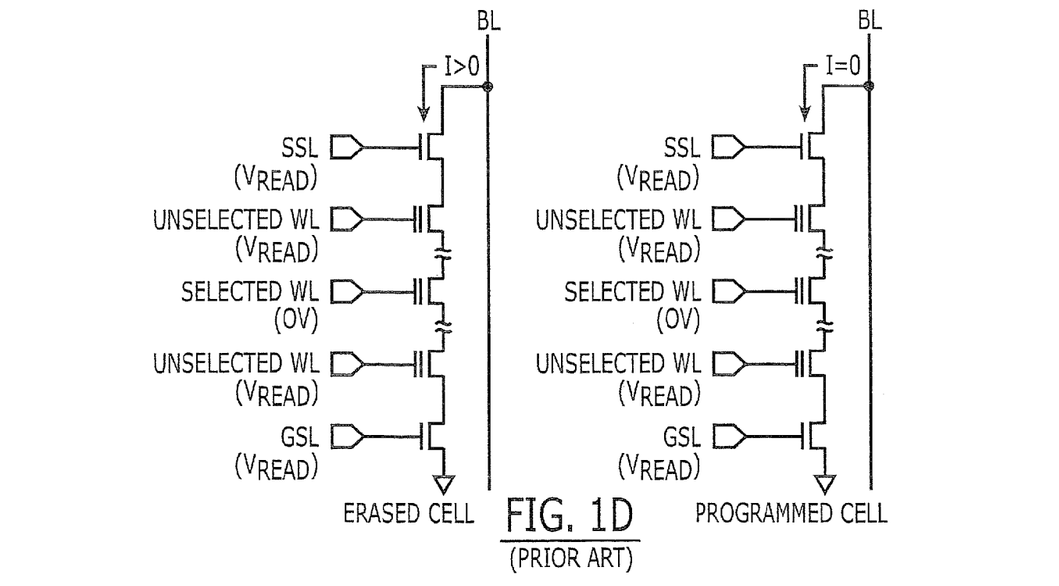
FIG. 1D illustrates current flow in a NAND-type string during operations to read data from an erased EEPROM cell and a programmed EEPROM cell according to the prior art.

Moreover, the programmed state or erased state of an EEPROM cell may be detected by performing a read operation on a selected cell. As illustrated by FIG. 1D, a NAND string will operate to discharge a precharged bit line BL when a selected cell is in an erased state and the selected word line voltage (e.g., 0 Volts) is greater than the threshold voltage of the selected cell. However, when a selected cell is in a programmed state, the corresponding NAND string will provide an open circuit to the precharged bit line BL because the selected word line voltage (e.g., 0 Volts) is less than the threshold voltage of the selected cell and the selected cell remains "off". Other aspects of NAND-type flash memories are disclosed in an article by Jung et al., entitled "A 3.3 Volt Single Power Supply 16-Mb Nonvolatile Virtual DRAM Using a NAND Flash Memory Technology," IEEE Journal of Solid-State Circuits, Vol. 32, No. 11, pp. 1748-1757, November (1997), the disclosure of which is hereby incorporated herein by reference.

Figure 2:
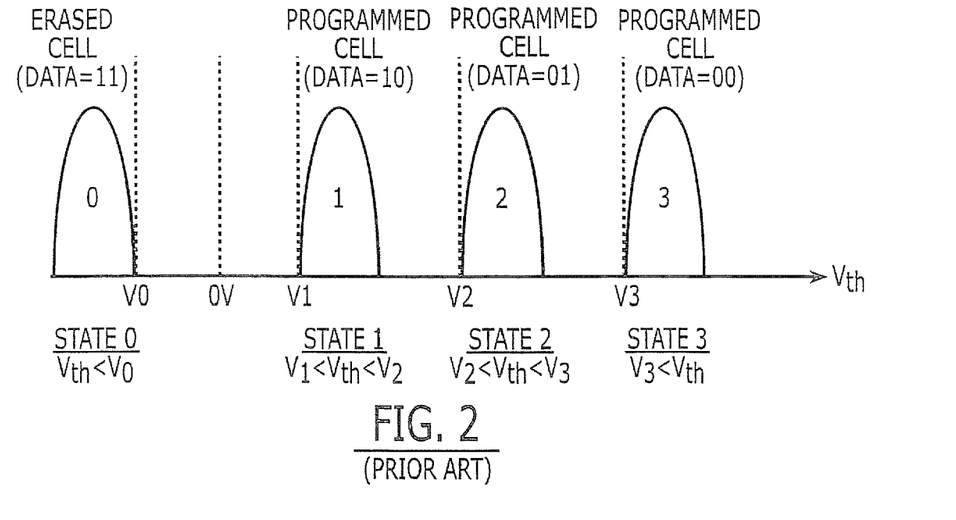
FIG. 2 is a graph illustrating the relative threshold voltages of a four-state EEPROM cell according to the prior art.

EEPROM cells that support multiple programmed states are typically referred to as multi-level cells (MLC). As illustrated by FIG. 2, an MLC that supports an erased state and three different programmed states operates to store two data bits per cell. These and other aspects of an MLC having two data bits per cell is disclosed in an article by Takeuchi et al., entitled "A Multipage Cell Architecture for High-Speed Programming Multilevel NAND Flash Memories," IEEE Journal of Solid-State Circuits, Vol. 33, No. 8, pp. 1228-1238, August (1998). Commonly assigned U.S. Pat. Nos. 5,862,074 and 5,768,188 also disclose aspects of multi-level EEPROM cells arranged in a NAND-type configuration, the disclosures of which are hereby incorporated herein by reference.

Figure 3A:
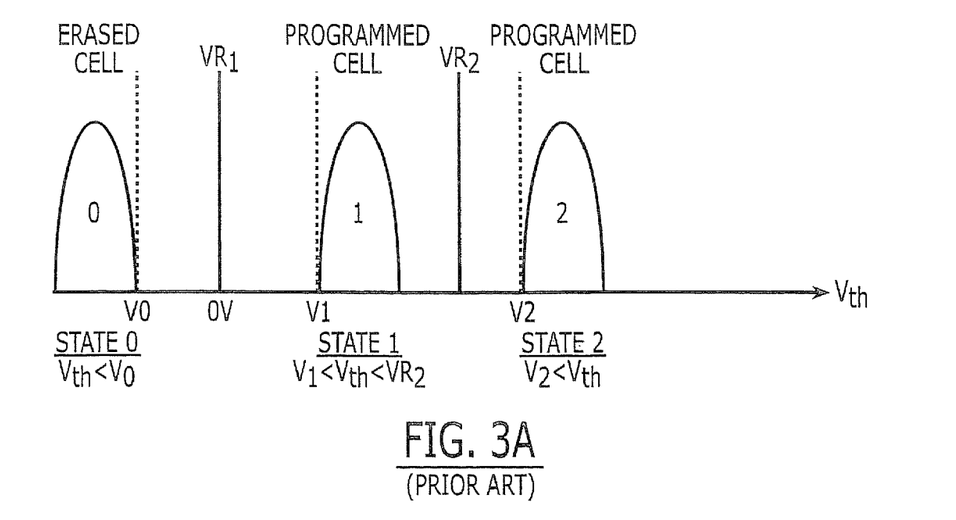
FIG. 3A is a graph illustrating the relative threshold voltages of a three-state EEPROM cell according to the prior art.
Figure 3B:
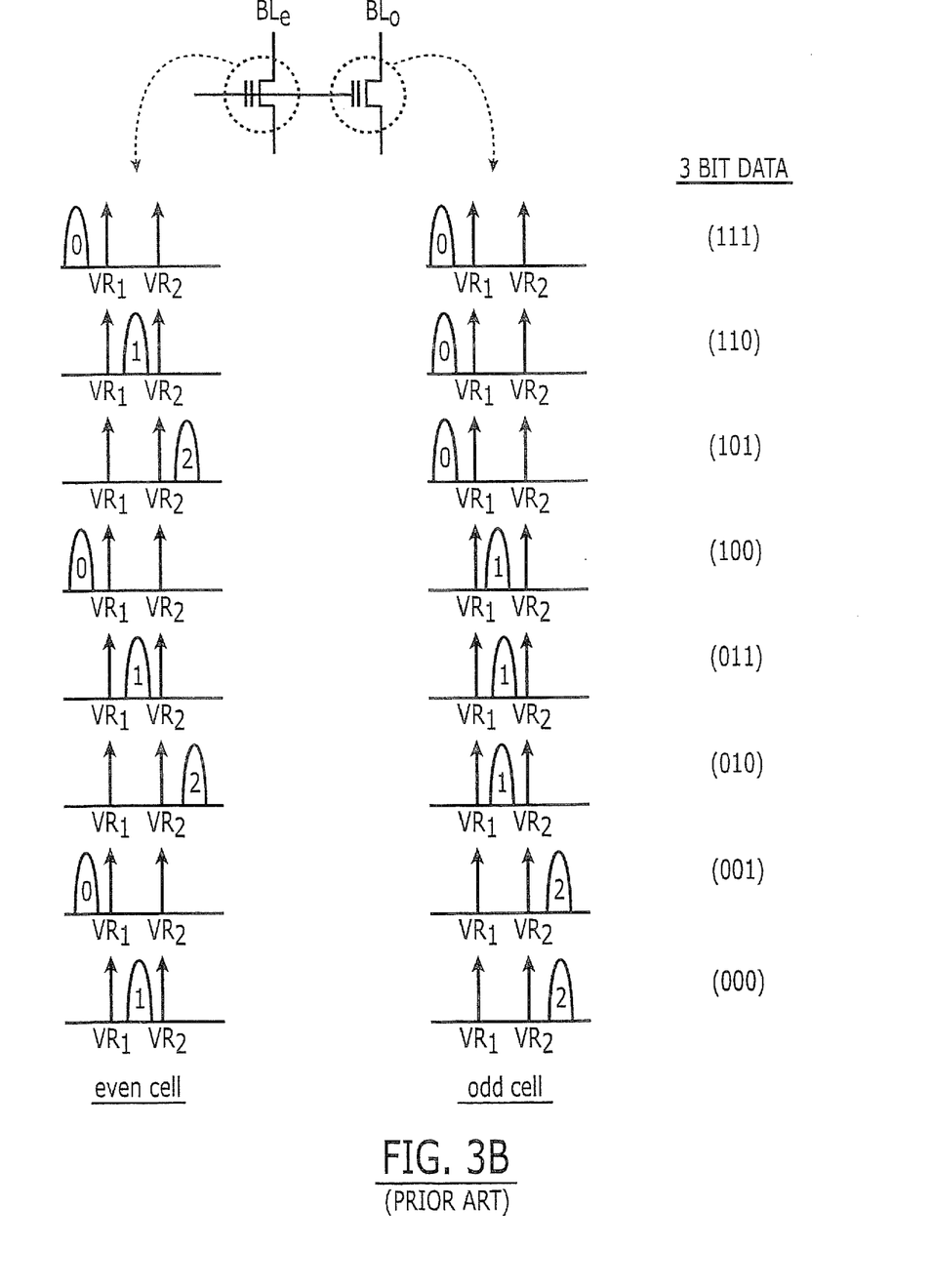
FIG. 3B illustrates the threshold voltage distributions of two adjacent three-state EEPROM cells that support 3-bit data when paired together in the same row of memory.

FIGS. 3A-3B illustrate how a pair of three-state EEPROM cells may support 3-bit programming. In FIG. 3A, an MLC is illustrated as supporting an erased state and two possible programmed states. As will be understood by those skilled in the art, the erased state may be distinguished from the two possible programmed states by applying a first reference voltage VR1 to a control electrode of a selected EEPROM cell during a read operation. This first reference voltage VR1 should be set to a level between the maximum acceptable threshold voltage of an erased cell (shown as V0) and the minimum acceptable threshold voltage of a cell programmed to state 1 (shown as V1). Similarly, the second programmed state (state 2) may be distinguished from the erased and first programmed states by applying a second reference voltage VR2 to a selected EEPROM cell during a read operation. This second reference voltage VR2 should be set to a level between the maximum acceptable threshold voltage of a cell programmed to state 1 and the minimum acceptable threshold voltage of a cell programmed to state 2 (shown as V2). As illustrated by FIG. 3B, two adjacent three-level EEPROM cells in the same physical row of memory may be programmed into one of eight possible states ((111), (110), (001), (000)) to support 3-bits of data per cell pair. Additional aspects of three-state EEPROM cells are disclosed in an article by Tanaka et al., entitled "A 3.4-Mbyte/sec Programming 3-Level NAND Flash Memory Saving 40% Die Size Per Bit," 1997 Symposium on VLSI Circuits Digest of Technical Papers, Section 9.3, pp. 65-66 (1997). Unfortunately, the use of 3-state EEPROM cells in the pair configuration of FIG. 3B may require the use of complex error detection and correction circuitry because any single cell failure will typically result in a corresponding 3-bit data error for both cells in the corresponding pair.

SUMMARY

Embodiments of the invention include nonvolatile memory devices that support virtual page storage using odd-state memory cells and methods of programming nonvolatile memory devices. In some of these embodiments, an integrated circuit device is provided with a nonvolatile memory array therein. This memory array includes at least two nonvolatile odd-state memory cells that operate individually as respective physical memory cells and collectively as a single virtual memory cell. The memory array is further configured so that programming of the virtual memory cell is verified at only a single reference voltage for all values of data contained in the virtual memory cell. The memory array may also be configured as a flash memory array and reading of the virtual memory cell may occur by evaluating whether any of the physical memory cells associated with the virtual memory cell are programmed to a threshold voltage in excess of the single reference voltage.

Additional embodiments of the invention include a flash memory array having at least first and second blocks of three-state memory cells therein. Each of these blocks of memory cells may contain multiple pages of memory cells. These first and second blocks of three-state memory cells operate individually as first and second blocks of physical memory cells, respectively, and collectively as a block of virtual memory cells. The first block of memory cells may include a plurality of NAND strings of EEPROM cells. In some embodiments, each of the plurality of NAND strings of EEPROM cells includes at least one SLC EEPROM cell that does not support virtual cell programming.

Still further embodiments of the invention include methods of operating flash memory devices. These methods include programming a NAND-type EEPROM array with a third page of data by initially reading first and second pages of data from the NAND-type EEPROM array and then overwriting the first and second pages of data with modified data. This overwriting operation encodes three pages of data into two pages of EEPROM cells in the NAND-type EEPROM array.

Additional operating methods include encoding a third page of flash memory data into first and second pages of flash memory data to thereby generate first and second pages of encoded flash memory data. A first page of flash memory cells in a flash memory device is then programmed with the first page of encoded flash memory data. A second page of flash memory cells in the flash memory device is also programmed with the second page of encoded flash memory data. A third page of flash memory data may then be generated in response reading the first and second pages of encoded flash memory data from the first and second pages of flash memory cells, respectively.

DETAILED DESCRIPTION OF PREFERRED EMBODIMENTS

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals.

Figure 4A:
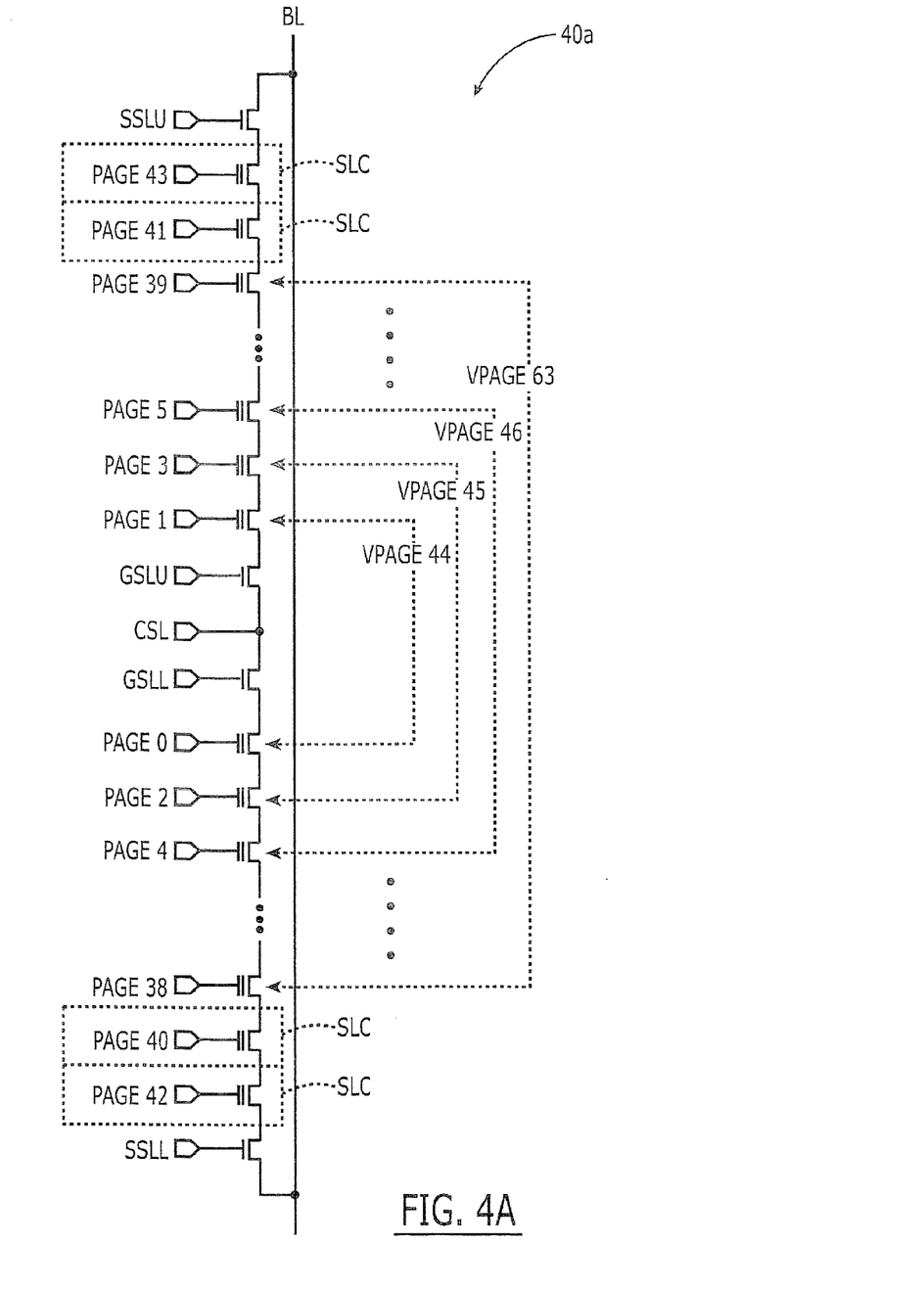
FIG. 4A is an electrical schematic of upper and lower NAND-type strings of EEPROM cells that support virtual page programming according to embodiments of the present invention.

Referring now to FIG. 4A, a single column 40a of EEPROM cells is illustrated as including a pair of NAND-type strings. This pair of NAN D-type strings includes an upper NAND-type string, which may belong to an upper block of EEPROM cells, which includes multiple pages of cells, and a lower NAND-type string, which may belong to a lower block of EEPROM cells, which includes multiple pages of cells. The upper and lower NAND-type strings are tied to a common source line CSL. The upper NAND-type string includes an NMOS transistor having a gate terminal connected to an upper string select line SSLU and an NMOS transistor having a gate terminal connected to an upper ground select line GSLU. The upper NAND-type string also includes a plurality of three-state EEPROM cells. These three-state EEPROM cells have control gates connected to respective word lines, which are associated with a plurality of pages of nonvolatile memory: PAGE 1, PAGE 3, ..., PAGE 39. A pair of SLC EEPROM cells associated with PAGES 41 and 43 are also provided. These SLC EEPROM cells may be outside the address space of virtual page programming and reading operations. Likewise, the lower NAND-type string includes an NMOS transistor having a gate terminal connected to a lower string select line SSLL and an NMOS transistor having a gate terminal connected to an lower ground select line GSLL. The lower NAND-type string also includes a plurality of three-state EEPROM cells. These three-state EEPROM cells have control gates connected to respective word lines, which are associated with a plurality of pages of nonvolatile memory: PAGE 0, PAGE 2, . . . , PAGE 38. A pair of SLC EEPROM cells associated with PAGES 40 and 42 are also provided. As described more fully hereinbelow with respect to FIGS. 4B-4E and 5A-5C, the EEPROM cells associated with the pages PAGE 0, PAGE 2, . . . , PAGE 38 of a lower block of memory and the EEPROM cells associated with the pages PAGE 1, PAGE 3, . . . , PAGE 39 of an upper block of memory may collectively form a plurality of "virtual" pages of nonvolatile memory. These "virtual" pages are illustrated as VPAGE44, VPAGE 45, . . . , VPAGE63. Accordingly, the column 40*a* of EEPROM cells is illustrated as supporting one column of a 64 page nonvolatile memory. Embodiments of the present invention are not limited to any particular capacity of memory, page width or NAND string length.

Figure 4B:
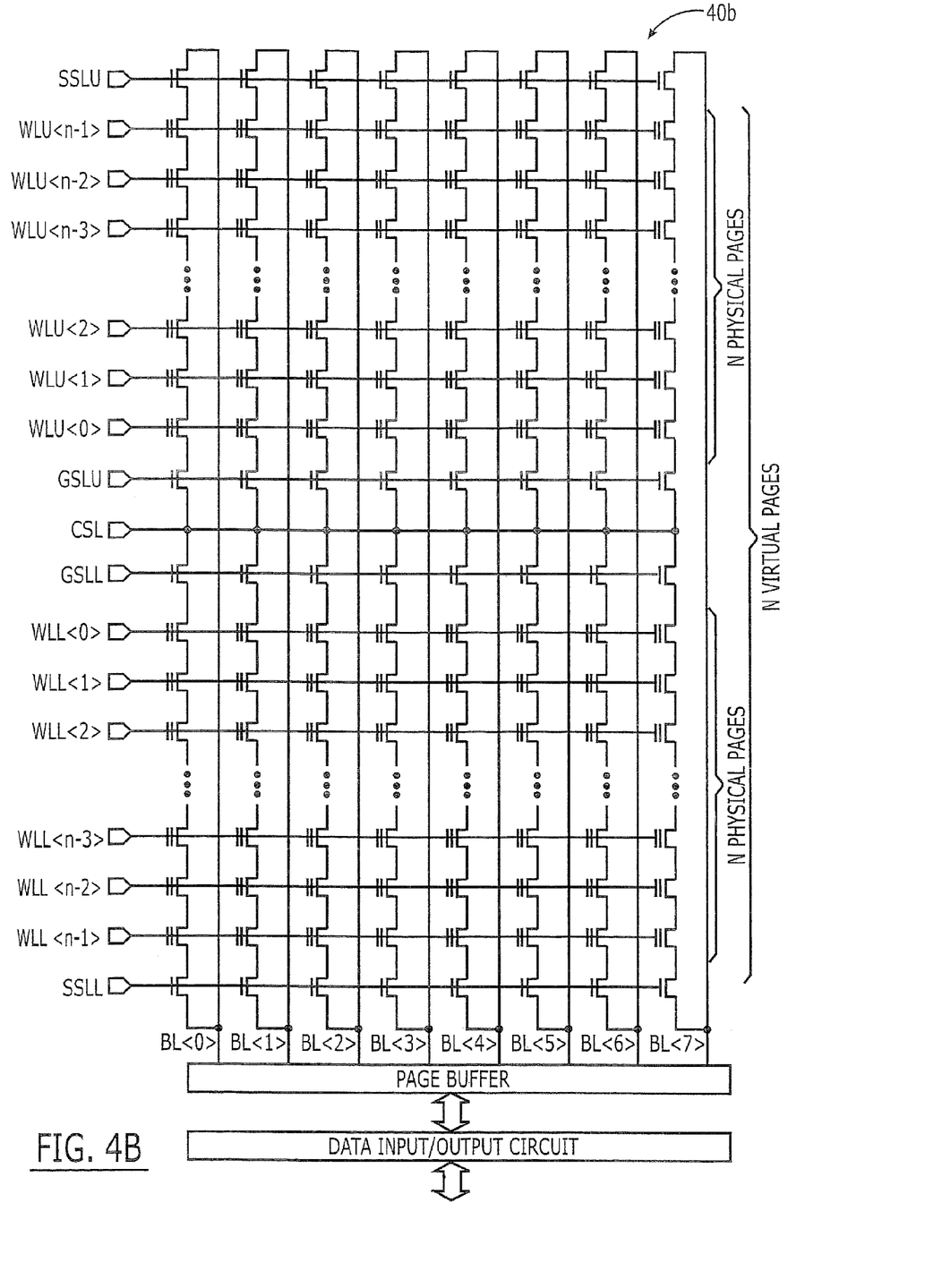
FIG. 4B is an electrical schematic of a NAND-type EEPROM device according to embodiments of the present invention.

FIG. 4B illustrates an EEPROM device 40*b* according to embodiments of the present invention. The EEPROM device 40*b* includes a nonvolatile memory array with upper and lower memory blocks, a page buffer and data input/output circuit. In particular, the EEPROM device 40*b* is illustrated as an eight column device that supports 2N "physical" pages (e.g., rows) of nonvolatile memory and N "virtual" pages of nonvolatile memory, but only incurs the memory array layout footprint (i.e., area penalty) of a conventional nonvolatile memory supporting 2N pages of SLC EEPROM cells.

Figure 4C:
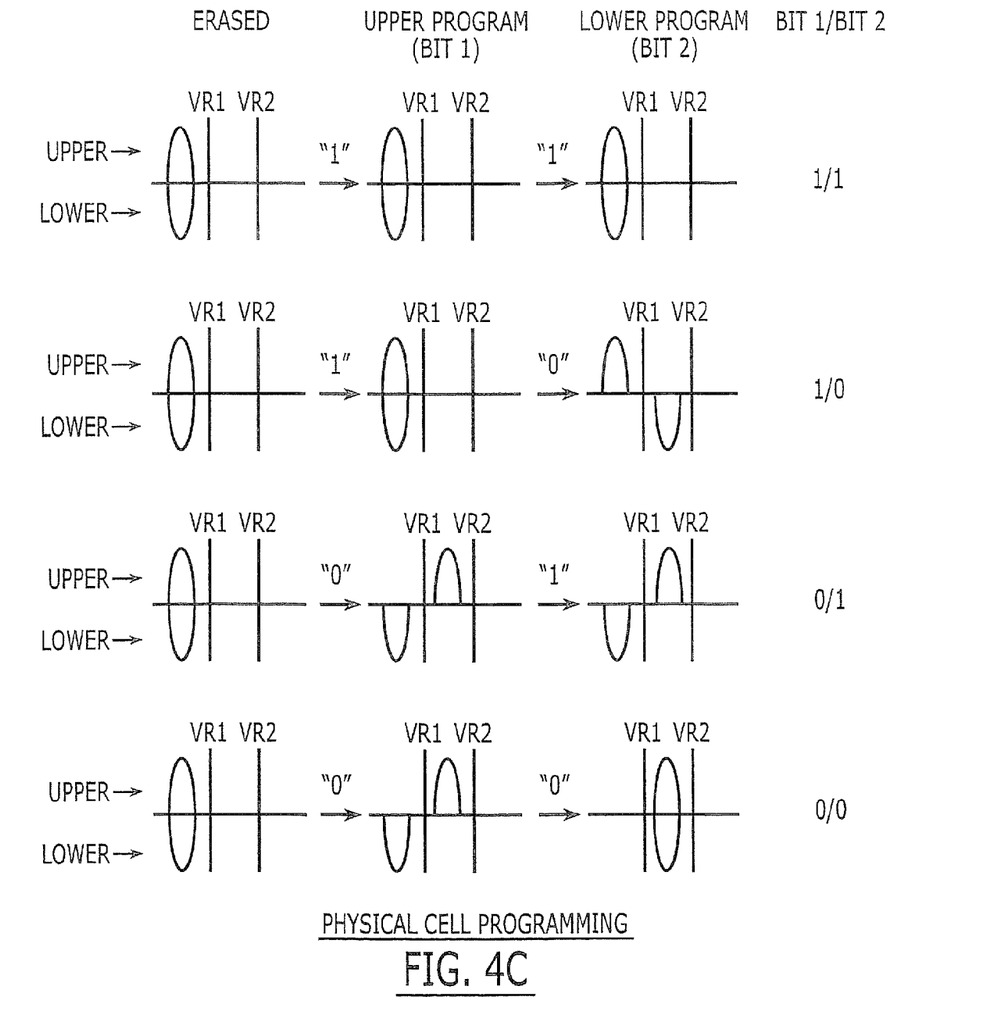
FIG. 4C is a diagram that illustrates operations to program three-state EEPROM cells, according to embodiments of the present invention.

FIG. 4C illustrates operations to program a corresponding pair of three-state EEPROM cells in a sequential manner, with the upper cell within the pair being programmed before the lower cell within the pair. This program order may be reversed. For purposes of illustration herein, the upper cell may be the EEPROM cell associated with word line WLU<0> and bit line BL<0> in FIG. 4B and the lower cell may be the EEPROM cell associated with word line WLL<0> and bit line BL<0> in FIG. 4B. As illustrated by FIG. 4C, the programming of two bits of "physical" data as 1/1 does not involve any change in the threshold voltages of the upper and lower cells within the pair. Thus, the threshold voltages of the upper and lower cells within the pair remain at their original "erased" levels (i.e., Vth<VR1, where VR1 is a first reference voltage). The programming of two bits of "physical" data as 1/0 does not involve any change in the threshold voltage of the upper cell, but causes the threshold voltage of the lower cell to be increased to a level between VR1 and VR2. Similarly, the programming of two bits of "physical" data as 0/1 causes the threshold voltage of the upper cell to be increased to a level between VR1 and VR2, but does not involve any change in the threshold voltage of the lower cell. Finally, the programming of two bits of "physical" data as 0/0 causes the threshold voltages of the upper and lower cells to be increased to a level between VR1 and VR2, as illustrated. The programming and reading operations for the upper cell are independent from that of the lower cell and vice versa.

Figure 4D:
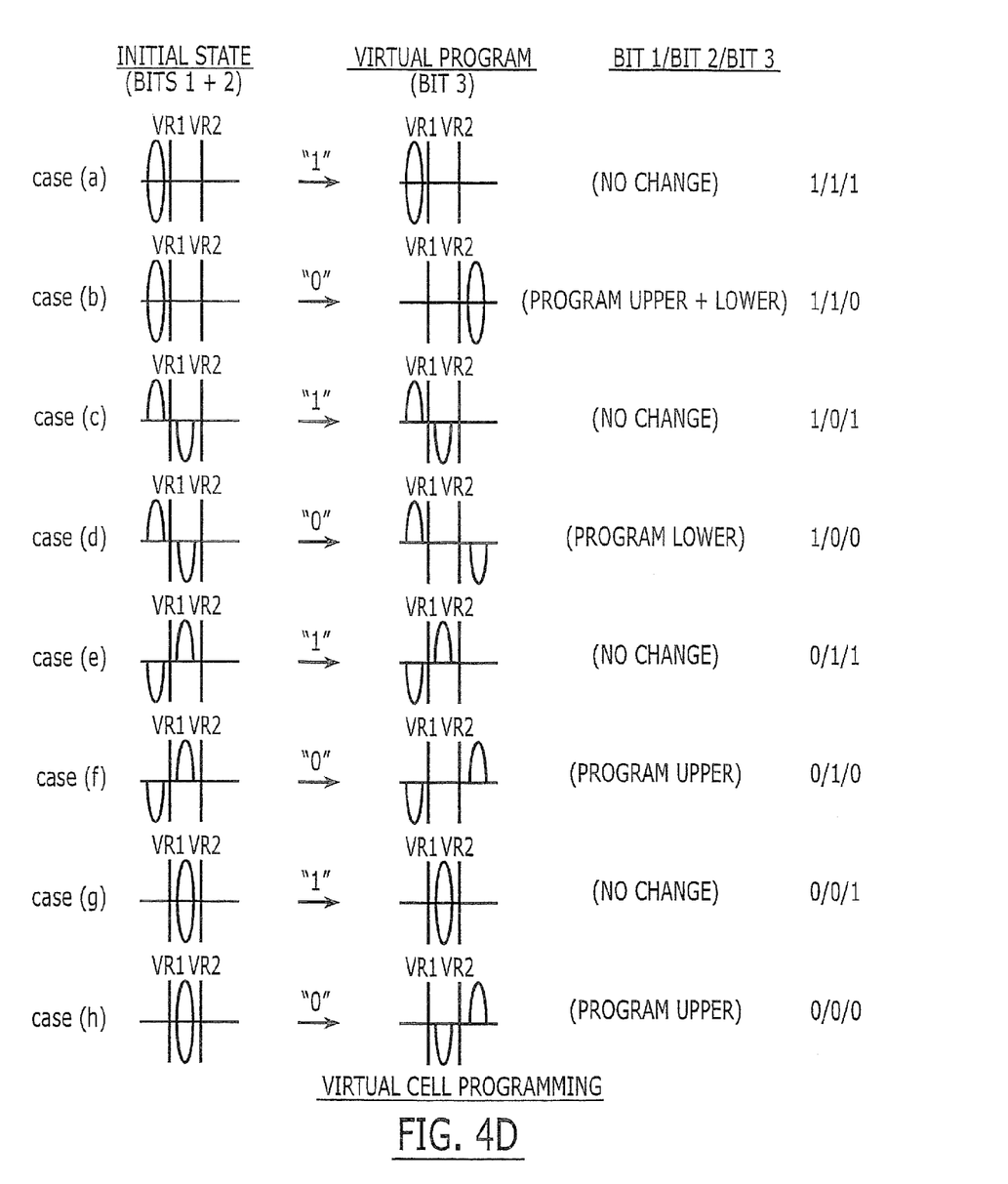
FIG. 4D is a diagram that illustrates operations to program three-state EEPROM cells, according to embodiments of the present invention.

FIG. 4D illustrates operations to program a corresponding pair of three-state EEPROM cells with a third bit of "virtual" data, after the pair has been programmed with two bits of "physical" data in accordance with FIG. 4C. These program operations include cases (a)-(h). In case (a), the "virtual" program operation does not require any change in the threshold voltages of the pair of cells to achieve 3-bit data as 1/1/1. In case (b), which is a special case (S), the "virtual" program operation requires increasing the threshold voltages of both upper and lower cells in the pair to levels in excess of VR2 (i.e., Vth>VR2, where VR2 is a second reference voltage), to achieve 3-bit data as 1/1/0. In case (c), the "virtual" program operation does not require any additional change in the threshold voltages of the pair of cells to achieve 3-bit data as 1/0/1. In case (d), the "virtual" program operation requires increasing the threshold voltages of the lower cell in the pair to a level in excess of VR2 to achieve 3-bit data as 1/0/0. In case (e), the "virtual" program operation does not require any additional change in the threshold voltages of the pair of cells to achieve 3-bit data as 0/1/1. In case (f), the "virtual" program operation requires increasing the threshold voltage of the upper cell in the pair to a level in excess of VR2 to achieve 3-bit data as 0/1/0. In case (g), the "virtual" program operation does not require any additional change in the threshold voltages of the pair of cells to achieve 3-bit data as 0/0/1. Finally, in case (h), the "virtual" program operation requires increasing the threshold voltage of the upper cell in the pair to a level in excess of VR2 to achieve 3-bit data as 0/0/0.

Figure 4E:
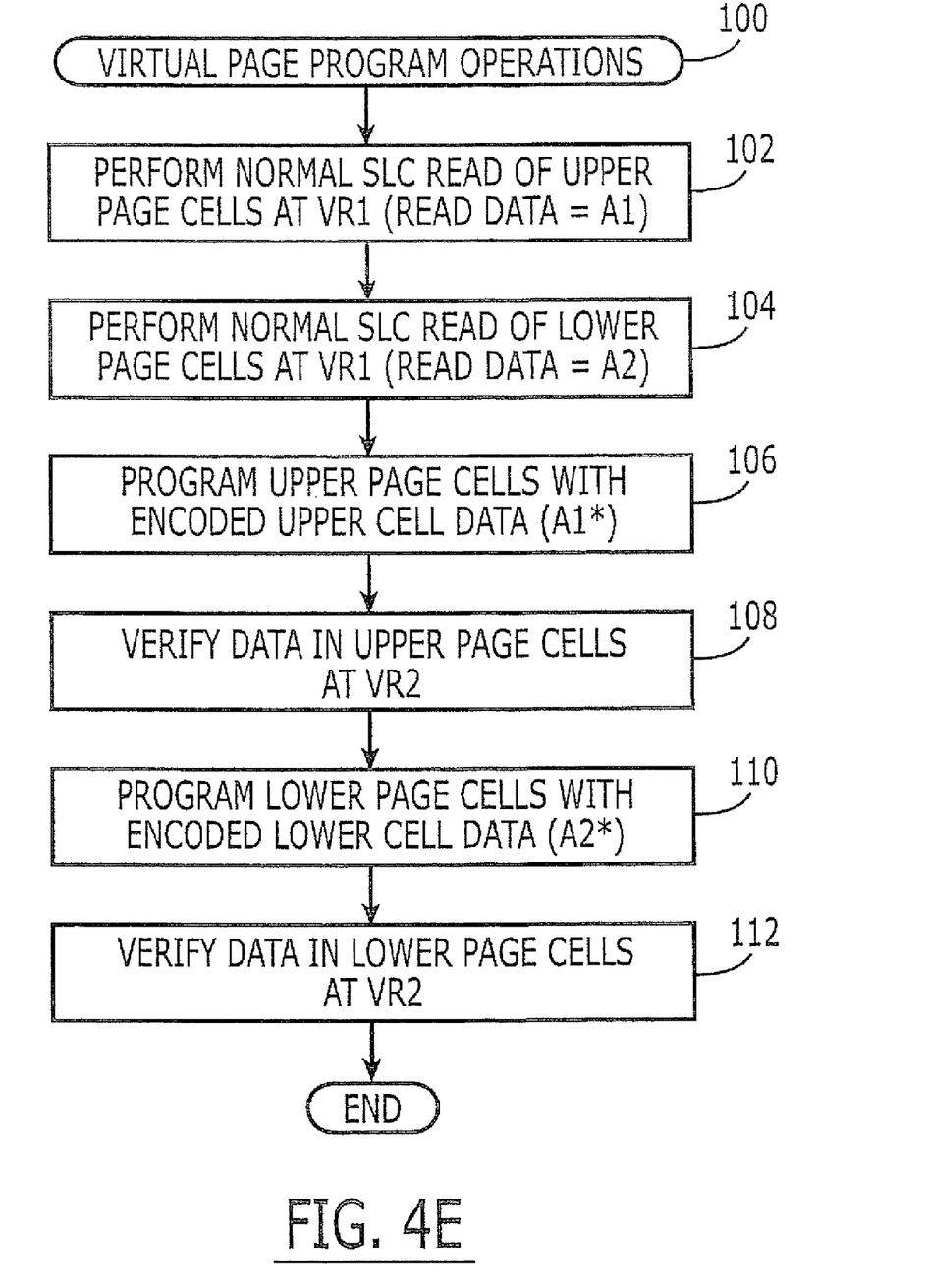
FIG. 4E is a flow diagram that illustrates operations to program "virtual" pages of EEPROM cells, according to embodiments of the present invention.

In particular, each virtual page program operation includes a plurality of read operations from corresponding upper and lower physical pages within a multi-page memory array having upper and lower blocks. As illustrated by Block 102, EEPROM cells in an upper page of the memory array can be read using a normal SLC read operation. This SLC read operation includes setting a selected word line in an upper block of the memory array to the first reference voltage VR1. This upper page of read data is identified by the reference character A1. Thereafter, a corresponding lower page of data can be read using a normal SLC read operation, Block 104. This SLC read operation includes setting a selected word line in a lower block of the memory array to the first reference voltage VR1. This lower page of read data is identified by the reference character A2.

Figures 5A, 5B:
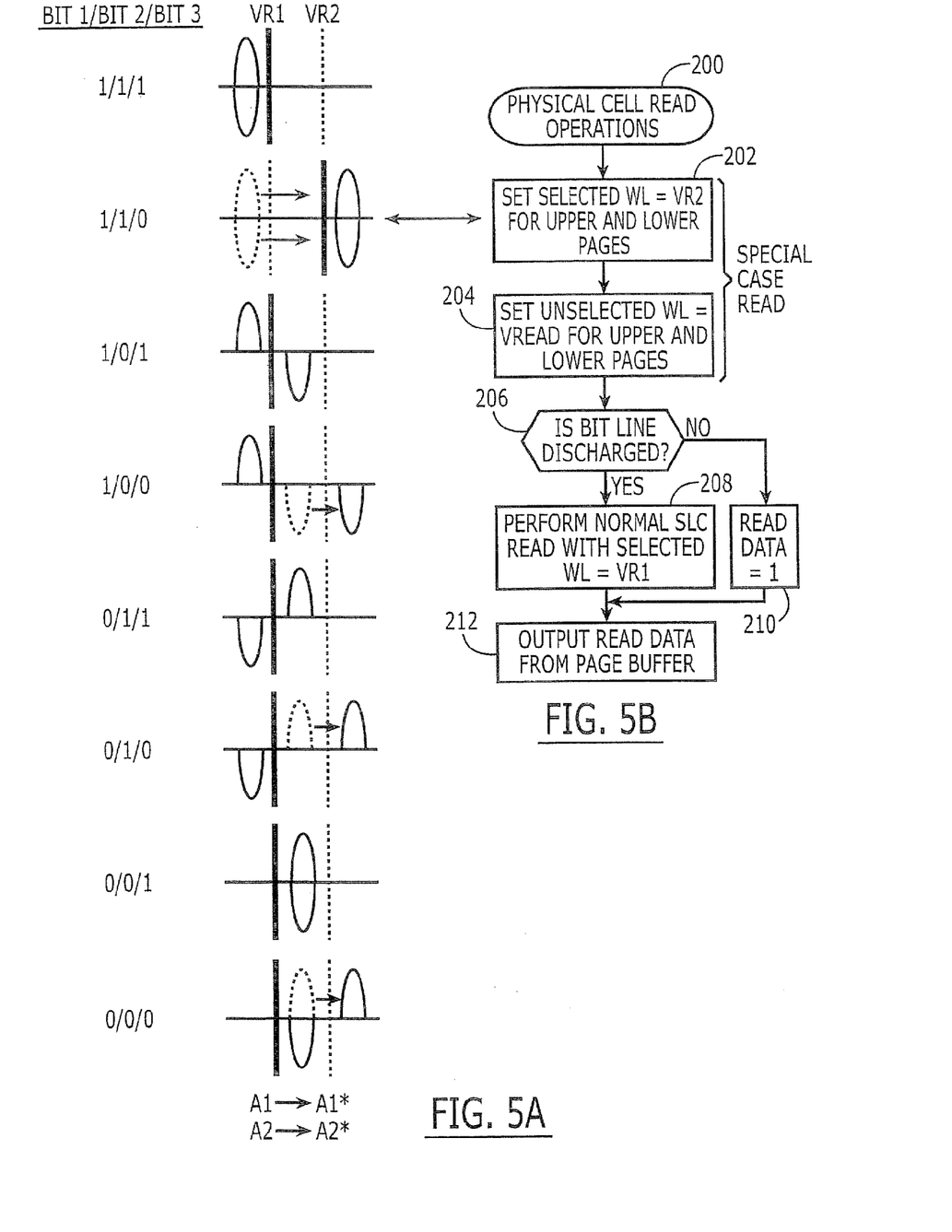
FIG. 5A illustrates operations to program a virtual EEPROM cell, according to embodiments of the present invention.
FIG. 5B is a flow diagram illustrating operations to read data from three-state EEPROM cells, according to embodiments of the present invention.

A virtual page of data, referred to herein as a third page of data A3, is then programmed into a "virtual" page of the memory array by encoding both the upper page of "physical" data A1 and the lower page of "physical" data A2 with this third page of data A3. These encoding operations result in the generation of "encoded" upper cell data A1\* and "encoded" lower cell data A2\*. As illustrated by FIG. 5B, these encoding operations are non-destructive, which means that A1 can be decoded directly from A1\* and A2 can be decoded directly from A2\*. These encoding operations may be illustrated more fully by reference to FIGS. 4D and 5A, for an example case where a first page of data, A1<7:0>, equals <10110001>, a second page of data, A2<7:0>, equals <01110110> and a third page of data, A3<7:0>, equals <10001010>:

$$A1\langle 7{:}0\rangle = \langle 10110001\rangle;$$
$$A2\langle 7{:}0\rangle = \langle 01110110\rangle; \text{ and}$$
$$\underline{A3\langle 7{:}0\rangle = \langle 10001010\rangle}$$
$$\Downarrow (\text{ENCODE})$$
$$A1^*\langle 7{:}0\rangle = \langle 10^P SS00^P 01\rangle; \text{ and}$$
$$A2^*\langle 7{:}0\rangle = \langle 01SS0110^P\rangle.$$

In this example, the superscript "P" in A1\*<7:0> and A2\*<7:0> designates further programming to raise a threshold voltage above VR2 and "S" designates the special case (b) illustrated by FIG. 4D where both lower and upper cells within a pair are further programmed to have threshold voltages in excess of VR2. Thus, among other things, the above example illustrates that one pair of EEPROM cells in column six (6) of the EEPROM device 40b is programmed to support 3-bits of data as 0/1/0 (i.e., A1<6>=0, A2<6>=1 and A3<6>=0), which corresponds to case (f) in FIG. 4D. Another pair of EEPROM cells in column zero (0) of the EEPROM device 40b is programmed to support 3-bits of data as 1/0/0 (i.e., A1<0>=1, A2<0>=0 and A3<0>=0), which corresponds to case (d) in FIG. 4D.

Referring again to FIG. 4E and also FIG. 5A, once the encoded data A1* and A2* is generated in response to reading from the upper and lower pages of data A1 and A2, Blocks 102-104, the corresponding upper page of EEPROM cells associated with A1 is programmed with the encoded data A1* and then verified at the second reference voltage VR2, Blocks 106 and 108. Thereafter, the corresponding lower page of EEPROM cells associated with A2 is programmed with the encoded data A2* and then verified at the second reference voltage VR2, Blocks 110 and 112. This upper and lower programming order may be reversed in alternative embodiments of the invention.

FIG. 5B illustrates operations 200 to read "physical" data from selected pages of EEPROM cells. This "physical" data corresponds to BIT 1 and BIT 2 of the three bit data illustrated by FIG. 5A. These read operations 200 include the performance of a special case read operation from corresponding upper and lower pages of a nonvolatile memory array. As illustrated by Blocks 202 and 204, this special case read operation includes setting the selected word lines for the upper and lower pages in the upper and lower blocks, respectively, at the second reference voltage VR2 while concurrently setting the unselected word lines at VREAD. As illustrated by Block 206, a check is then made to determine whether any of the corresponding bit lines, which are connected to the upper and lower blocks, are discharged. If this check results in a negative answer, which means the special case is present (i.e., BIT1/BIT2/BIT3=1/1/0), then the read data for the corresponding physical cell equals a logic 1 value, Block 210. However, if the check results in a positive answer, then a normal SLC read is performed on the selected cell with the selected word line set to the first reference voltage VR1, Block 208. The read data for a selected physical page is then output from a page buffer, Block 212. Thus, for the above example, a special case read of the selected upper page (programmed with A1*<7:0>=<10$^P$SS00$^P$01>) would result in the following first bit line condition: $BL_1$<7:0>=<00110000>, which indicates that A1<5:4>=<11>, Block 202-204. In contrast, a normal SLC read of the selected upper page (programmed with A1*<7:0>=<10110001>) would result in the following second bit line condition: $BL_2$<7:0>=<01111110>, Block 208. These first and second bit line conditions ($BL_1$<7:0>=<00110000> and $BL_2$<7:0>=<01111110>) are combined within the page buffer to thereby generate the value of A1<7:0> as <10110001>, Block 212. This value of A1 is generated by inverting every bit associated with the second bit line condition, subject to the constraint set by the first bit line condition, which requires that A1<5:4>=<11> because of the presence of special case programming.

Figure 5C:
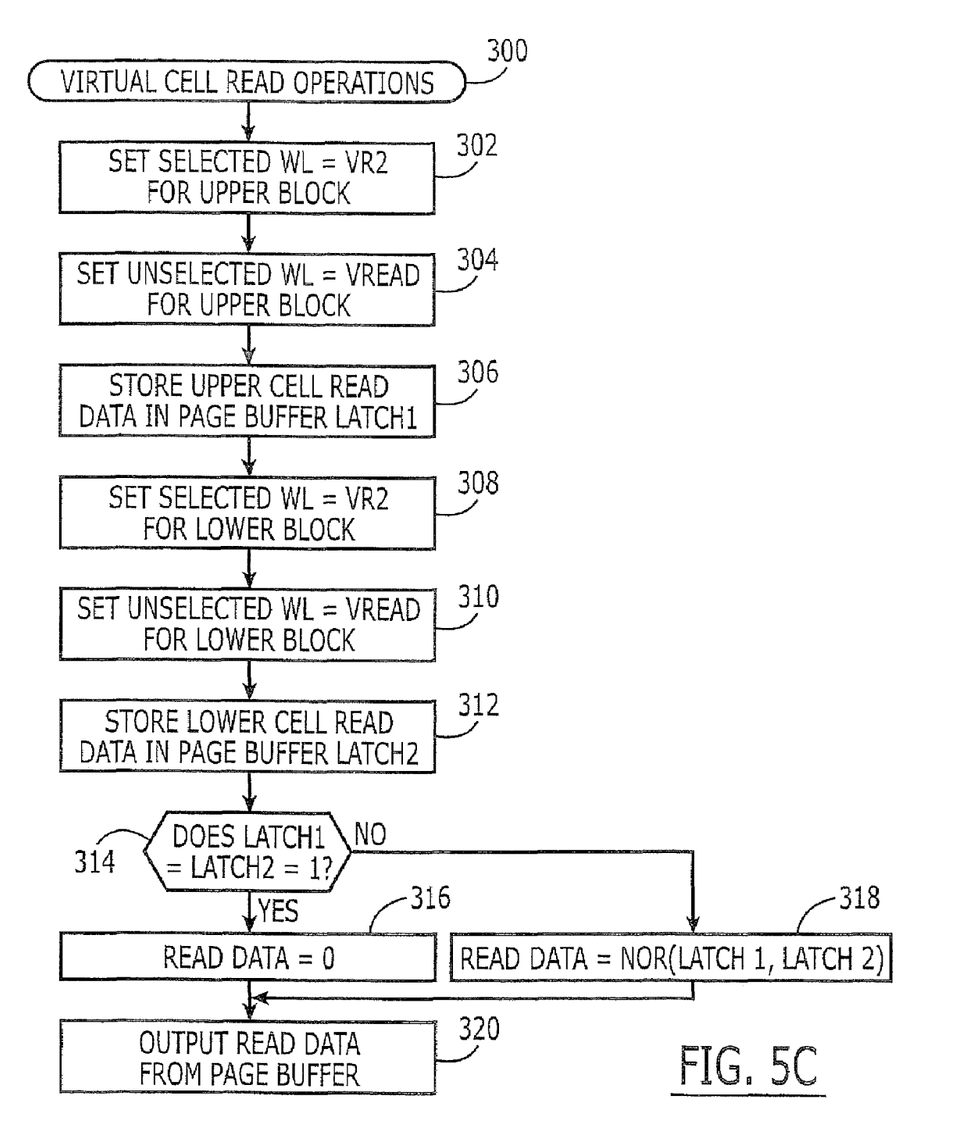
FIG. 5C is a flow diagram illustrating operations to read data from three-state EEPROM cells, according to embodiments of the present invention.

FIG. 5C illustrates operations 300 to read "virtual" data from a pair of pages of EEPROM cells. At Blocks 302 and 304, the selected and unselected word lines for the upper block are set to VR2 and VREAD, respectively, to detect whether any of the cells in the selected upper page satisfy the case (b), case (f) or case (h) conditions identified by FIG. 4D. Thus, for the above example (programmed with A1*<7:0>=<10$^P$SS00$^P$01>), this read operation would result in the following third bit line condition: $BL_3$<7:0>=<01110100>, which is stored in a first latch within the page buffer, Block 306. Thereafter, at Blocks 308 and 310, the selected and unselected word lines for the lower block are set to VR2 and VREAD, respectively, to detect whether any of the cells in the selected lower page satisfy the case (b) or case (d) conditions identified by FIG. 4D. Thus, for the above example (programmed with A2*<7:0>=<01SS0110$^P$>), this read operation would result in the following fourth bit line condition: $BL_4$<7:0>=<00110001>, which is stored in a second latch within the page buffer, Block 312.

At Block 314, the data with the first and second latches is compared on a bit-by-bit basis:

$$BL_3<7:0>=<01110100>;$$

$$BL_4<7:0>=<00110001>.$$

Because only $BL_3$<5:4>=$BL_4$<5:4>=<11>, A3<5:4>=<00>, Block 316. At Block 318, a NOR operation is performed on the remaining bits to yield A3<7:6;3:0>=<10;1010>. The data is then output from the page buffer, Block 320. In other embodiments of the present invention, the page buffer may perform alternative operations to resolve the above-described read operations.

The above-described programming operations illustrated by FIG. 4D illustrate how embodiments of the present invention are relatively immune from multi-bit errors caused in response to threshold voltage programming errors. For example, if the programming state illustrated by case (a) is erroneously reflected as a case (c) or case (e) state upon reading, then the correct 3-bit data value of 1/1/1 will be erroneously reflected upon reading as 1/0/1, which represents a single bit error in A2, or 0/1/1, which reflects a single bit error in A1. Likewise, if the programming state illustrated by case (g), for example, is erroneously reflected as a case (c), case (e) or case (h) state upon reading, then the correct 3-bit data value of 0/0/1 will be erroneously reflected upon reading as 1/0/1, which represents a single bit error in A1, or 0/1/1, which reflects a single bit error in A2, or 0/0/0, which reflects a single bit error in A3. The same is true for other programming states illustrated by FIG. 4D.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A non-volatile semiconductor memory device, comprising:
   a memory cell array comprising a plurality of upper and lower memory strings, each of the plurality of upper and lower memory strings having electrically erasable and programmable memory cells serially connected, each of the plurality of upper and lower memory strings having a plurality of odd-state memory cells storing therein an odd number of threshold voltage states and at least one even-state memory cell storing therein at least one even number of threshold voltage states;
   a plurality of bit lines, each of the plurality of bit lines connected to one end of a corresponding one string of the plurality of upper memory strings through corresponding upper string select transistors and to one end of a corresponding one string of the plurality of lower memory strings through corresponding lower string select transistors;

a common source line, the common source line connected the other end of the plurality of upper and lower memory strings through corresponding ground select transistors of the plurality of upper and lower memory strings; and a plurality of word lines which are connected to respective cells in the plurality of upper and lower memory strings wherein reading and programming a bit of data from the odd-state memory cells is performed by enabling more than one word line to be selected.

2. The non-volatile semiconductor memory device of claim 1, wherein the odd-state memory cells are operated in the unit of two cells, the unit of two cells comprises one odd-state memory cell of the upper memory strings and one odd-state memory cell of the lower memory strings.

3. The non-volatile semiconductor memory device of claim 2, wherein the odd-state memory cells are three-state memory cells and the even-state memory cells are two-state memory cells.

4. The non-volatile semiconductor memory device of claim 3, wherein at least one of the two-state cells is connected in one end of strings near the bit line.

5. A non-volatile semiconductor memory device, comprising:

a memory cell array comprising a plurality of memory strings, each of the plurality of memory strings having erasable and programmable memory cells serially connected, each of said plurality of memory strings having at least one memory cell storing therein an odd number of threshold voltage states and at least one even-state memory cell storing therein at least one even number of threshold voltage states;

a plurality of bit lines, each of the plurality of bit lines connected to one end of a corresponding one string of the plurality of upper memory strings through corresponding upper string select transistors and to one end of a corresponding one string of the plurality of lower memory strings through corresponding lower string select transistors;

a common source line, the common source line connected the other end of the plurality of upper and lower memory strings through corresponding ground select transistors of the plurality of upper and lower memory strings; and a plurality of word lines which are connected to respective cells in the plurality of upper and lower memory strings wherein reading and programming a bit of data from the odd-state cells is performed by activating a bit line.

6. The non-volatile semiconductor memory device of claim 5, wherein the odd-state memory cells are operated in the unit of two cells, the unit of two cells comprises one odd-state memory cell of the upper memory strings and one odd-state memory cell of the lower memory strings.

7. The non-volatile semiconductor memory device of claim 5, wherein the odd-state memory cells are three-state memory cells and the even-state memory cells are two-state memory cells.

8. The non-volatile semiconductor memory device of claim 7, wherein at least one of the two-state cells is connected to one end of strings near the bit line.

* * * * *